Figure 1:
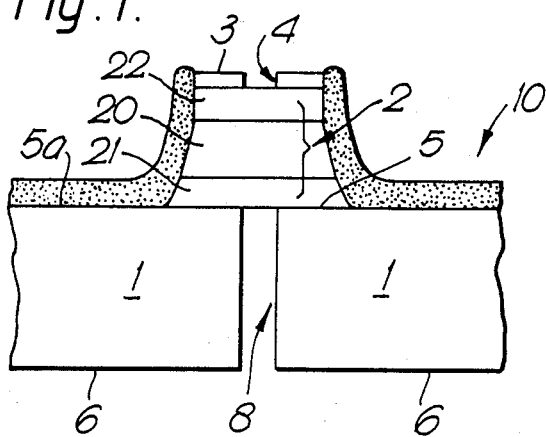

United States Patent [19]

Dobson

[11] Patent Number: 4,838,987

[45] Date of Patent: Jun. 13, 1989

[54] METHOD OF ETCHING A SEMICONDUCTOR BODY

[75] Inventor: Peter J. Dobson, South Croydon, England

[73] Assignee: U.S. Philips Corporation, New York, N.Y.

[21] Appl. No.: 184,322

[22] Filed: Apr. 21, 1988

[30] Foreign Application Priority Data

Apr. 24, 1987 [GB] United Kingdom ............... 8709727

[51] Int. Cl.⁴ .................. H01L 21/306; B44C 1/22; C03C 15/00; C03C 25/06
[52] U.S. Cl. .................................. 156/626; 156/635; 156/643; 156/644; 156/655; 156/649; 156/662; 219/121.69; 219/121.85; 437/129; 437/225
[58] Field of Search ............ 156/635, 643, 644, 655, 156/657, 662, 649, 626; 219/121 LH, 121 LJ, 121 LU, 121 LM; 332/7.51; 357/16, 17, 19, 30, 56; 427/53.1; 437/2, 3, 225, 129

[56] References Cited

U.S. PATENT DOCUMENTS 4,518,456  5/1985  Bjorkholm .................. 156/626
4,525,687  6/1985  Chemla et al. ............. 332/7.51

Primary Examiner—William A. Powell
Attorney, Agent, or Firm—Paul R. Miller

[57] ABSTRACT

A method of etching a semiconductor body having first (6) and second opposed surfaces and having a first semiconductor region (1) adjacent the first surface (6) and a second semiconductor region (2) disposed between the first semiconductor region and the second surface, the first (1) and second (2) semiconductor regions being formed such that the second semiconductor region (2) first absorbs radiation at a wavelength less than the wavelength at which the first semiconductor region first absorbs radiation. The second surface provides an optically distinguishable feature, for example an optically opaque conductive layer (3) formed with an aperture (4). The method further comprises aligning a radiation source with the feature (4) and activating the radiation source to produce radiation having a wavelength or range of wavelengths shorter than or equal to that at which the first semiconductor region (1) first absorbs radiation but longer than that at which the second semiconductor region (2) first absorbs radiation so that the radiation induces etching of the first semiconductor region in alignment with the optically distinguishable feature of the second surface but does not induce etching of the second region (2) so enabling a hole (8) to be formed aligned with the aperture (4) to allow light to pass through the second region (2) which may comprise a transmission etalon in the form of a multiple quantum well structure.

10 Claims, 1 Drawing Sheet

METHOD OF ETCHING A SEMICONDUCTOR BODY

DESCRIPTION

This invention relates to a method of etching a semiconductor body, which method comprises providing a semiconductor body having first and second opposed surfaces and a first semiconductor region adjacent the first surface, bringing an etchant and the first surface into contact with each other, directing a radiation source towards the first surface, activating the radiation source to produce radiation having a wavelength or range of wavelengths shorter than or equal to that at which the first semiconductor region first absorbs radiation so as to induce etching of the first semiconductor region where the radiation is incident on the first surface.

Such a method is described in U.S. Pat. No. 4,518,456 and in various papers. Thus, for example, the paper by F. A. Houle published in Applied Physics A 41 (Solids and Surfaces) 1986 at pages 315 to 330, that electromagnetic radiation (hereinafter referred to as radiation) in particular laser radiation, can be used to induce etching of a semiconductor surface in the presence of an appropriate etchant and papers by D. V. Podlesnik et al published in Applied Physics Letters 45(5) Sept. 1, 1984 at pages 563 to 565 and in Applied Physics Letters 48(7) Feb. 17, 1986 at pages 496 to 498, illustrate the use of laser induced etching to form holes in gallium arsenide.

According to one aspect of the present invention, there is provided a method of etching a semiconductor body, which method comprises providing a semiconductor body having first and second opposed surfaces and a first semiconductor region adjacent the first surface, bringing an etchant and the first surface into contact with each other, directing a radiation source towards the first surface, activating the radiation source to produce radiation having a wavelength or range of wavelengths shorter than or equal to that at which the first semiconductor region first absorbs radiation so as to induce etching of the first semiconductor region where the radiation is incident on the first surface, characterised by providing the semiconductor body with an optically distinguishable feature on the second surface and by aligning the radiation source with the optically distinguishable feature so that the radiation induces etching of the first semiconductor region in alignment with the optically distinguishable feature of the second surface.

As used herein, the term 'radiation' should be understood to mean electromagnetic radiation and the term 'optically distinguishable' should be understood to mean distinguishable by radiation, for example by whether the feature transmits or reflects incident radiation of a given wavelength or range of wavelengths.

A method embodying the invention enables the technique of radiation induced etching to be used to form holes simply and precisely in a first surface of a semiconductor body aligned with an optically distinguishable feature on a second opposed surface of the semiconductor body.

After being aligned with the optically distinguishable feature, the radiation source may be moved along a predetermined path, for example under computer control, to enable a groove or grating or other pattern to be etched on the first surface so as to be aligned with or referenced to the optically distinguishable feature of the second surface. The optically distinguishable feature may be, for example, an aperture in an electrically conductive optically opaque layer, an electrically conductive optically opaque contact area or an area of semiconductor material having different optical properties from the surrounding material. This invention also relates to a method of manufacturing a semiconductor device using such an etching technique.

Devices such as transmission etalons for use as, for example, optically bistable switch elements, electro-optic modulators or self-electro-optic devices (SEEDs) may be grown, using an appropriate technique, as a multiple quantum well or superlattice struture on a first region or substrate of different material. For example, a transmission etalon device may be grown as a multiple quantum well or superlattice structure of alternate layers of gallium aluminium arsenide ($Ga_xAl_{1-x}As$ where x indicates the relative proportions of gallium and arsenide) and gallium arsenide (GaAs) on a gallium arsenide substrate. In order to enable the radiation transmitting properties of the etalon device to be controlled, an electrically conductive optically opaque contact layer is required on a top or free surface of the etalon structure. An aperture is provided in the contact layer to enable radiation to exit the etalon structure. The substrate, GaAs in the above example, on which the etalon structure is provided will normally be opaque to the wavelength range which the etalon structure is designed to transmit. In order to enable radiation to enter or exit the lower surface of the etalon, a passage through the opaque substrate is required. In order to provide such a passage the entire substrate may be removed as described in U.S. Pat. No. 4,525,687 and the etalon structure bonded to a support, for example a sapphire support as described in U.S. Pat. No. 4,525,687 which is transparent in the wavelength range of the etalon. However the process of removal of the substrate and subsequent bonding to the new support is time consuming and the risk of damage to the etalon structure during the bonding process, in particular, is high.

Similar problems to those described above also arise in the manufacture of semiconductor surface light emitting devices, e.g. diode lasers, where light emission is perpendicular to the substrate. An alternative solution to the removal of the entire substrate as mentioned above is discussed in a paper by Wu et al published in Electronics Letters Jan. 29, 1987 Vol 23 No 3 where photolithography is used to define a window through which the GaAs substrate of a gallium arsenide—gallium aluminium arsenide double heterostructure diode laser is etched away to enable a partially transparent silver film to be deposited on the exposed n type gallium aluminium arsenide cladding layer of the diode structure. As indicated in the paper, however, special skill is required in aligning the mask with the active area of the mesa diode structure and the process is both time consuming and very much dependent on the skills of the person carrying out the mask alignment. U.S. Pat. No. 4,525,687 also mentions briefly with reference to FIG. 19 of the US Patent that a selective chemical etch may be used to provide a hole or passage through the substrate but as indicated in FIG. 19 this results in a hole which is much larger than is actually required and may cause undue weakening of the substrate.

Using a method embodying the invention, a semiconductor device such as a transmission etalon my be manufactured by providing a substrate having first and second opposed surfaces, growing a multiple quantum well or superlattice structure on the second surface of the substrate, defining the multiple quantum well or superlattice structure as a mesa structure on the substrate, providing an electrically conductive contact having an aperture on a free surface of the mesa structure opposed to the first surface of the substrate, directing a laser radiation source towards the first surface, aligning the laser radiation source with the aperture in the electrically conductive contact on the free surface of the mesa, bringing an etchant and the first surface into contact with each other, activating the laser radiation source so as to produce electromagnetic radiation of a wavelength less than that at which the substrate first absorbs electromagnetic radiation but greater than that at which the mesa structure first absorbs radiation so that the electromagnetic radiation from the laser induces etching of the substrate in alignment with the aperture in the electrically conductive contact to form a hole in alignment with the aperture and extending through the substrate to the mesa structure. The mesa structure may commence with a buffer layer (for example of $Ga_xAl_{1-x}As$ where the substrate is GaAs and the multiple quantum well or superlattice structure comprises alternate layers of GaAs and $Ga_xAl_{1-x}As$) transparent to the radiation used for etching, so as to ensure etching stops at the interface between the mesa structure and the substrate. Using such a method a hole of very small diameter may be produced and moreover by altering the focus of the laser the diameter of the hole may be controlled. The hole through the substrate manufactured by a method embodying the invention is preferably of the same or similar dimensions to the aperture in the electrically conductive contact and may be as small as a few micrometers.

A hole produced using a method embodying the invention may be used as a light guide for electromagnetic radiation entering or exiting a semiconductor device manufactured using a method embodying the invention. The characteristics of the light guide may be optimised, especially in the case of a transmission etalon, if the etalon is designed to operate at a wavelength which is the same or similar to the wavelength of the electromagnetic radiation used to induce etching to form the hole or light guide.

A method embodying the invention preferably comprises aligning the radiation source with the optically distinguishable feature so that when the radiation source is activated the radiation is incident on the first surface normally of the first surface. However, the radiation source may be aligned so as to provide radiation which is incident at an angle to the normal of the first surface so as to enable a slanting hole or groove, etc. to be etched through the first region in alignment with the optically distinguishable feature.

Two or more spaced-apart radiation sources for each producing the radiation having a wavelength or range of wavelengths shorter than or equal to that at which the first semiconductor region first absorbs radiation, the relative orientations of the two or more radiation sources being predetermined, may be provided to enable two or more holes to be etched, one of the holes being aligned with the optically distinguishable feature and the or each other hole having a predetermined spatial relationship with the one hole (and therefore the optically distinguishable feature) dependent on the predetermined spatial relationship and relative orientations of the radiation sources. One or more lasers may be used as the radiation sources.

The or a radiation source may be aligned with the optically distinguishable feature by directing a beam of radiation from a subsidiary radiation source having a fixed orientation relative to the radiation source at the semiconductor body, effecting relative movement between the semiconductor body and the radiation sources and detecting the amount of radiation from the subsidiary radiation source transmitted and/or reflected by the second surface. The amount of radiation from the subsidiary radiation source transmitted or reflected by the second surface may be detected using a radiation detector such as a photodetector. The subsidiary radiation source may be a white light source. Alternatively where the or one of the radiation sources is tunable between two wavelengths (ranges) only one of which will induce etching of the first region, the other of the two wavelengths (ranges) of the radiation source may be used as the subsidiary radiation source.

A radiation detector may be used to monitor the etching of the first semiconductor region. If radiation detectors are used to monitor the alignment of the radiation source and the progress of the etching, then the whole process may quite easily be automated and in any case requires no special skills of any operator.

Figure 2:
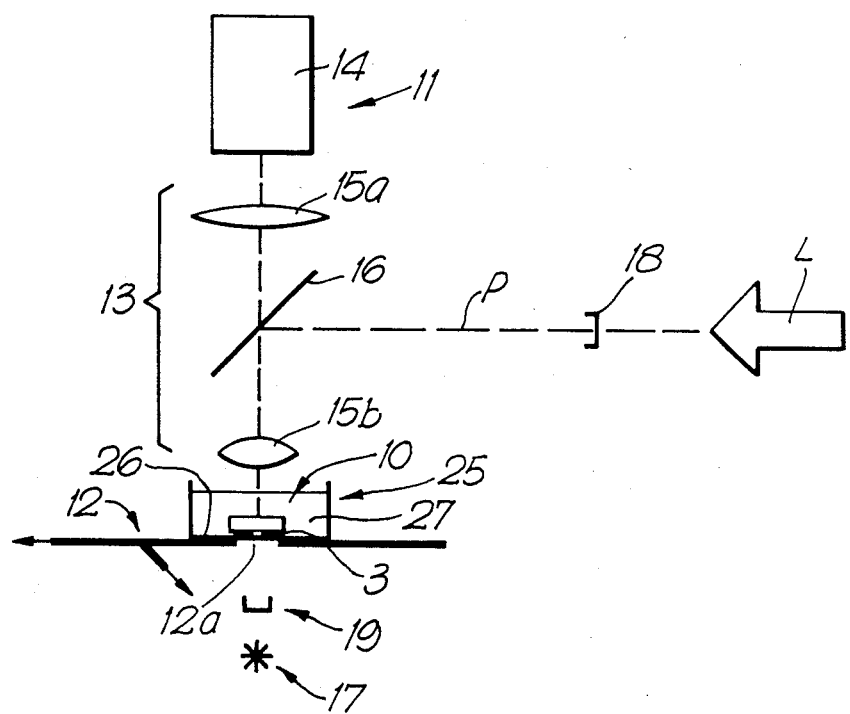

An embodiment of the invention will now be described, by way of example, with reference to the accompanying drawing, in which FIG. 1 illustrates schematically and in section a semiconductor device manufactured using a method in accordance with the present invention; and FIG. 2 illustrates schematically apparatus for carrying out a method in accordance with the present invention.

It should be understood that the Figures are diagrammatic and are not drawn to scale. In particular, in FIG. 1, the relative dimensions of parts of the device shown may have been altered, for example thickness of layers may be exagerated in the interests of clarity. Again in the interests of clarity, although FIG. 1 is a cross-sectional view, cross-hatching has been omitted.

Referring firstly to FIG. 1, there is illustrated a transmission etalon device for, for example an optical bistable switch element, an electro-optic modulator or a self-electro-optic effect device (SEED), which comprises s semiconductor body 10 having a first semiconductor region or substrate 1 on which is epitaxially grown (for example by molecular beam epitaxy (MBE) or metal organic vapour phase epitaxy (MOVPE) a second semiconductor region or thin (typically of the order of one micrometer or less in thickness) etalon structure 2, the second semiconductor region being formed so as to first absorb radiation at a wavelength less than that at which the first semiconductor region first absorbs radiation. In this example the substrate 1 is a gallium arsenide substrate which may be semi-insulating or of n-type conductivity with a thickness of approximately 100 micrometers while the second region 2 is a thin (typically approximately one micrometer in thickness etalon structure in the form of a layer of $Ga_xAl_{1-x}As$ (gallium aluminium arsenide where x defines the relative proportions of gallium and aluminium) or, as shown, a multiple quantum well or superlattice structure 20 consisting of alternate layers of GaAs and $Ga_xAl_{1-x}As$, the multiple quantum well or superlattice structure 20 being sandwiched between two buffer layers 21 and 22 of $Ga_xAl_{1-x}As$. In this instance the $Ga_x$-

$Al_{1-x}As$ layers 21 and 22 serve, respectively, to provide an electrical contact and an optical window to the multi-quantum well or superlattice structure 20. The etalon could however comprise a multi-quantum well or superlattice structure, without the $Ga_xAl_{1-x}As$ layers 21 and 22.

A further region 3 is provided on a surface 5 of the etalon structure 2 opposite a given or first surface 6 of the substrate. An aperture 4 through which radiation can exit the etalon structure 2 is defined through the further region 3 by photolithographic and etching techniques. The aperture 4 forms an optically distinguishable feature carried by the second surface 5.

In order to enable electrical contact to be made to the etalon structure 2 to, for example, enable an electrical field to be applied across the etalon structure 2 and the substrate 1 to modify the radiation transmitting characteristics of the etalon 2, in this example the further region 3 is an electrically conductive layer, for example a metal layer, in the arrangement discussed above a gold layer contacting the $Ga_xAl_{1-x}As$ surface 5 of the etalon. Where the further region 3 is to be used as an electrical contact, a similar conductive layer (not shown) may be provided on the surface 6 of the substrate 1.

As shown, the etalon structure 2 is defined by known photolithographic and etching techniques to form a mesa structure on the substrate 1, exposed edges 2a of the etalon structure 2 and exposed areas 5a of the surface of the substrate being covered by insulating or passivating material 7, for example silicon dioxide, silicon nitride, polyamide or polyimide.

The GaAs substrate 1 of the transmission etalon device described above is opaque to the wavelength at which the device is to be used and it is therefore necessary to etch away the substrate 1 to enable radiation to enter or exit the etalon structure 2. It is normally desirable to remove only a small portion of the substrate 1 so as not to reduce unnecessarily the physical strength of the devices to be integrated on the same substrate 1 and so as to enable good heat sinking. Thus it is desirable to form merely a small diameter hole, such as the hole 8 shown in FIG. 1, through the substrate.

A method embodying the invention will now be described which enables such a hole to be etched through the substrate. FIG. 2 illustrates diagrammatically apparatus for carrying out the method.

As shown in FIG. 2, the apparatus comprises a microscope and camera system 11 having an X-Y movable support table 12. The microscope and camera system 11 comprises a camera 14 and an optical system 13. The optical system 13 comprises an eyepiece lens 15a, a half-silvered mirror 16 and an objective lens 15b. The optical axis A of the optical system 13 is aligned with an aperture 12a within the X-Y movable table 12.

A radiation source, in this example a laser, indicated by the broad arrow L, is mounted to the side of the microscope and camera system 11, so that radiation from the radiation source travels along a path p and is reflected downwardly by the half-silvered mirror 16 along optical axis A. Thus, as shown, the half-silvered mirror 16 extends across the optical axis A at 45 degrees thereto and the radiation source L is aligned so that radiation from the source L is incident at an angle of 45 degrees to the normal of the half-silvered mirror 16.

A subsidiary radiation source or illuminator 17, such as an incandescent lamp, is positioned below the X-Y movable table 12 so as to be aligned with the aperture 12a and the optical axis A. A first radiation detector 18 is movable into or out of the radiation path p between the radiation source L and the half-silvered mirror 16 so as to, as will be described hereinafter, detect light from the subsidiary radiation source 17 passing through the sample. A second radiation detector 19 is movable into or out of alignment with the optical axis A at a position between the aperture 12a of the X-Y movable positioning table 12 and the subsidiary radiation source 17 so as to detect, as will be described hereinafter, the termination of the etching procedure. The radiation detectors 18 and 19 may be photodiodes.

In use of the apparatus illustrated diagrammatically in FIG. 2 to etch a hole 8 through the GaAs substrate 1 described in the example given above, the semiconductor body 10 is placed in a container 25 which is transparent to the radiation to be used and the container 25 positioned on the X-Y movable table 12 so that the semiconductor body 10 is positioned over the aperture 12a. It should be appreciated that, in this example, when the semiconductor body is positioned in the container the conductive layer 3 and the aperture 4 in the layer 3 have already been provided but that the mesa structure, if desired, need not necessarily have been formed. Thus, the semiconductor body 10 may, as shown diagrammatically in FIG. 2, when placed in the container have an etalon structure layer 2 contiguous with the substrate 1 and a conductive layer 3 extending over the majority of the surface of the etalon structure layer 2.

The semiconductor body 10 is placed face down in the container 25, that is with the conductive layer 3 next to a base 26 of the container 25.

The subsidiary radiation source 17 is then activated and while observing the semiconductor body 10 through the camera 14 of the microscope and camera system 11, the X-Y movable table 12 is moved until the aperture 4 of the conductive layer 3 shows up as a bright spot and is thus aligned with the optical axis A of the microscope and camera system 11.

The output of the radiation detector 18 which is positioned on the path p and which is receptive to the wavelength(s) of the subsidiary radiation source 17, is then maximised by moving the container 25 using the X-Y movable table 12 until the aperture 4 of the conductive layer 3 is precisely aligned with the optical axis A. Having thus aligned the aperture 4, the radiation detector 18 is moved out of the optical path p and an etchant 27 is introduced into the container to cover the given surface 6.

In this example where the substrate 1 is semi-insulating or n-type GaAs, the etchant used may comprise a mixture of $H_2SO_4$: $H_2O_2$: $H_2O$ in the proportions (by volume) 1:1:100. Other suitable etchants are described in the papers mentioned above.

It may be possible for the alignment of the microscope stage 11 to be carried out after introduction of the etchant 27 provided the subsidiary radiation source 17 does not produce radiation which may interact to cause premature etching. The subsidiary radiation source 17 may be selected such that both the first and second regions 1 and 2 (but not of course the third region 3) are transparent to the subsidiary radiation or so that the second region, for example, absorbs only part of the subsidiary radiation wavelength range.

After the etchant has been introduced, the microscope and camera system 11 is refocused using the objective lens 15b, the radiation detector 18 having been moved out of the optical path p. The laser radiation source L is then switched on so as to direct radiation at the given surface 6 and the subsidiary radiation source switched off. The wavelength of the radiation output of the laser is selected so as to be longer than that at which the second semiconductor region or etalon structure 2 first absorbs radiation but shorter than or equal to that at which the first semiconductor region 1 first absorbs radiation. Thus the laser wavelength is chosen such that the energy $hc/\lambda$ (where $\lambda$ is the laser wavelength) is less than the absorption energy $E_2$ of the etalon structure 2 but greater than the bandgap energy $E_1$ of the substrate 1. In the example given above where the substrate 1 is GaAs and the etalon structure 2 comprises multiple quantum well or superlattice structure of alternate GaAs and $Ga_xAl_{1-x}As$ layers, then the laser may be a continuous (CW) operation dye laser with an output wavelength of 700-850 nm and an output power density in the range of approximately 1 to 10000 $Wcm^{-2}$ depending on the doping of the first region, a lower power density being required for a highly n-type doped substrate 1. In the example being described, laser light is incident on the given surface 6 normally of the given surface 6 to enable a hole 8 extending perpendicularly of the given surface 6 to be produced. Depending upon the desired diameter of the hole 8, the laser beam may be focused to a smaller spot on the given surface 6 using the objective lens 15b. The diameter down to which the spot may be focused will of course depend on the focal length and aperture of the objective lens 15.

The laser light focused onto the given surface 6 and absorbed thereby causes the photogeneration of carriers within the semiconductor material near the surface 6 and the photogenerated minority carriers at the interface between the given surface 6 and the etchant induce or accelerate etching. As etching proceeds the etched structure may, as described in the afore-mentioned paper published in Applied Physics Letters 48(7), Feb, 17, 1986 at pages 496 to 498, act as a hollow waveguide which confines and efficiently transmits the incident laser beam. This waveguiding effect enables vertical etching allowing a hole with vertical side walls to be etched.

As hole 8 of 100 micrometers depth is etched at a rate of approximately 5 to 10 micrometers per minute for a laser power density of approximately 10 $Wcm^{31'}$. The diameter of the hole may be as small as a few micrometers, for example from 1 to 5 micrometers, depending on the diameter down to which the laser beam spot may be focused. Although in this example, the substrate 1 is only 100 micrometers thick, holes may be etched through thicker substrates, for example 250 micrometer thick substrates, as described in Applied Physics Letters 48(7) Feb, 17, 1986 pages 496 to 498. As the radiation used to induce the photochemical etching is not absorbed by the etalon structure, it does not act to induce etching within the etalon structure and accordingly photochemical etching stops at the interface between the first and second regions 1 and 2. The etching process can be observed via the camera 14 of the microscope stage 11 and also the second radiation detector 19 may be used to detect the end of etching because, as will be appreciated, as the etching proceeds, the amount of radiation from the laser source L passing through the semiconductor body 10 will increase until as the bottom of the hole being etched nears the mesa structure, the amount of radiation received by the detector increases very rapidly to reach a plateau when etching finishes at the interface between the first and second regions.

Although in the arrangement described above, n-type or semi-insulating GaAs is used as the substrate, the substrate could be of p-type GaAs. Where the substrate is of p-type GaAs then it may be necessary as described in the paper entitled 'Photoelectrochemical etching of p-GaAs" by F. W. Ostermayer et al published in Applied Physics Letters 39(1) July, 1, 1981 pages 76 to 78, to apply an electrical potential to the GaAs substrate and to switch the applied potential periodically between a value at which photoreduction occurs and a value at which oxidation occurs so as to remove the Ga layer formed at the surface during photoreduction and so facilitate etching.

The method described above may be used in any circumstance where it is desired to precisely align and etch a hole through one of two radiation semiconductor materials having appropriate different absorption characteristics at a selected radiation wavelength or range of wavelengths.

Although in the arrangement described above the further region 3 is a conductive layer provided directly on the surface 5 of the etalon structure, a further semiconductor region similar to the substrate 1 which absorbs radiation of the radiation source L and in which a hole similar to the hole 8 desired through the substrate 1 has already been formed may be provided between the further region 3 and the etalon structure 2. In such an arrangement the aperture 4 forming the optically distinguishable feature would be defined by the hole in the further semiconductor region and using a method embodying the invention the hole 8 subsequently etched in the substrate 1 could be precisely aligned thereto. The further region 3 may not be a permanent part of the semiconductor device but could be a radiation reflecting masking layer in which the aperture 4 is formed to enable precise alignment of the hole 8 to the reference aperture 4. Also, the aperture 4 need not necessarily be an aperture as such but could constitute a semiconductor region transparent to the radiation of the laser radiation source.

Similarly it should be appreciated that a method embodying the invention may be used to form a hole through the substrate aligned with any optically distinguishable feature on the opposite surface of the semiconductor body. For example, where an optically opaque feature such as a metal contact or track is provided on the opposite or second surface of the semiconductor body, then a hole may be formed so as to be aligned with that feature by either detecting, using the detector 18, minimum in the amount of light from the subsidiary radiation source transmitted by the semiconductor body or by positioning the subsidiary radiation source on the other side of the semiconductor body and detecting a maximum in the reflected light.

If a beam splitter is provided within the optical system, then a number of holes could be etched simultaneously, the separation and alignment between the holes being determined by the separation and alignment of the split beams. Similarly by replacing the objective lens 15b with a microlens array, a large number of closely spaced subsidiary laser beams can be provided enabling arrays of fine holes to be etched as may be particularly suitable for arrays of SEED or similar optical etalon structures. In either case, only one optically distinguishable feature needs to be carried by the second surface to define a reference point for the array. The diameters of the holes produced can be determined by the optical arrangement (in combination with the initial laser beam diameter). Also, in addition to holes, if the laser source can be scanned across the given surface, grooves and other desired patterns may be etched through the substrate or first region. The groove or series of holes could be a aligned with a metal track on the opposite surface via the camera 4 and the microscope optical system 13 using infra-red illumination directed from the position of the subsidiary radiation source 17 along the optical axis A. Where the subsidiary radiation source is a white light source a filter may be provided to filter out radiation from the white light source which might induce etching. The subsidiary radiation source may then be used as the infra-red source.

It is also envisaged that it may be possible using two or more precisely aligned laser beams of different wavelengths to etch different depth holes, a first wavelength for example enabling photochemical etching through only a first semiconductor layer, a second wavelength enabling photochemical etching through the first and a succeeding semiconductor layer and so on, a selected one of the radiation sources being aligned with the optically distinguishable feature and the other having a predetermined orientation to the one radiation source. Holes produced using a method embodying the invention may be used as light guides or passageways as described above or may form contact holes or holes into which material, for example semiconductor, metal or insulator may be deposited. In particular, metal may be plated onto the walls of the etched holes by replacing the etchant with a suitable plating technique. The above-mentioned paper by F. A. Houle describes several metal films which may be photochemically or photothermally deposited.

Although in the arrangement described above, a laser is used, other light sources, for example an arc or discharge lamp, with a suitable filter or filters may be used to provide the radiation source L. Where the radiation source L has an output wavelength or wavelength range which is alterable, for example a tunable laser or alternative filters or wavelength shifing devices, then the same radiation source may be used as both the main radiation source L and the secondary radiation source 17. In such an arrangement, a first wavelength or wavelength range which is not absorbed by the substrate would be used to align the radiation source with the optically distinguishable feature on the opposite or second surface of the semiconductor body by detecting the output of the detector 19 (or an alternative detector if the detector 19 is not sensitive to the first wavelength or wavelength range) and a second wavelength or wavelength range of the radiation source which is absorbed by the first region 1, but not by the second region 2 used for the photochemical etching. In such an arrangement, the detector 18 should not be required.

Also, a method embodying the invention is not restricted to to the particular example described above and could be applied to any semiconductor body having a first semiconductor region meeting a given surface of the body and a second semiconductor region adjoining the first region so that at least part of the second semiconductor region is spaced from the given surface by the first region, the first and second semiconductor regions being formed such that the second semiconductor region first absorbs radiation at a wavelength less than the wavelength at which the first semiconductor region first absorbs radiation although it should of course be appreciated that the radiation wavelength and power density plus the type of etchant used will have to be selected to suit the semiconductor material or materials involved.

From reading the present disclosure, other modifications will be apparent to persons skilled in the art. Such modificationa may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalisation or modification of one or more of those features whether or not it relates to the same invention as presently claimed in any claim and whether or not it mitigates any or all of the same technical problems as does the present invention. The applications hereby give notice that new claims may be formulated to such features and/or combinations of such features during the prosecution of the present application or of any further application derived therefrom.

I claim:

1. A method of etching a semiconductor body, which method comprises providing a semiconductor body having first and second opposed surfaces and a first semiconductor region adjacent the first surface, bringing an etchant and the first surface into contact with each other, directing a radiation source towards the first surface, activating the radiation source to produce radiation having a wavelength or range of wavelengths shorter than or equal to that at which the first semiconductor region first absorbs radiation so as to induce etching of the first semiconductor region where the radiation is incident on the first surface, characterised by providing the semiconductor body with an optically distinguishable feature on the second surface and by aligning the radiation source with the optically distinguishable feature so that the radiation induces etching of the first semiconductor region in alignment with the optically distinguishable feature of the second surface.

2. A method according to claim 1, which comprises providing the semiconductor body so that a second semiconductor is disposed between the first semiconductor region and the second surface, the first and second semiconductor regions being formed such that the second semiconductor region first absorbs radiation at a wavelength less than the wavelength at which the first semiconductor region first absorbs radiation, and which comprises activating the radiation source to produce radiation having a wavelength or range of wavelengths longer than at which the second semiconductor region first absorbs radiation.

3. A method according to claim 2, which comprises providing the second region by growing a multiple quantum well or superlattice structure on the first region.

4. A method according to claim 3, which comprises providing the first region as a gallium arsenide substrate and growing the multiple quantum well or superlattice structure as alternate layers of gallium aluminium arsenide and gallium arsenide.

5. A method according to claim 2, 3, or 4, which comprises providing the second region as at least part of a mesa structure on the first region.

6. A method according to 1, 2, 3 or 4, which comprises using a laser as the radiation source.

7. A method according to 1, 2, 3 or 4, which comprises aligning the radiation source with the optically distinguishable feature by directing a beam of radiation from a subsidiary radiation source having a fixed orientation relative to the radiation source at the semiconductor body, effecting relative movement between the semiconductor body and the radiation sources and detecting the amount of radiation from the subsidiary radiation source transmitted and/or reflected by the second surface.

8. A method according to 1, 2, 3 or 4, which comprises providing the optically distinguishable feature as an aperture in an electrically conductive layer carried on the second surface.

9. A method according to 1, 2, 3 or 4, which comprises using a radiation detector to detect the amount of radiation from the radiation source(s) passing through the semiconductor body to monitor the etching of the first semiconductor region.

10. A method of manufacturing a semiconductor device comprising the steps of providing a semiconductor body having first and second opposed surfaces and a first semiconductor region adjacent the first surface, bringing an etchant and the first surface into contact with each other, directing a radiation source towards the first surface, activating the radiation source to produce radiation having a wavelength or range of wavelengths shorter than or equal to that at which the first semiconductor region first absorbs radiation so as to induce etching of the first semiconductor region where the radiation is incident on the first surface, characterised by providing the semiconductor body with an optically distinguishable feature on the seond surface and by aligning the radiation source with the optically distinguishable feature so that the radiation induces etching of the first semiconductor region in alignment with the optically distinguishable feature of the second surface, wherein said etched semiconductor body forms a semiconductor device.

* * * * *